(12) United States Patent
Seike

(10) Patent No.: US 8,871,847 B2
(45) Date of Patent: Oct. 28, 2014

(54) COMPOSITION AND PHOTO-ELECTRIC CONVERTING ELEMENT OBTAINED USING THE SAME

(75) Inventor: Takahiro Seike, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 49 days.

(21) Appl. No.: 12/933,822

(22) PCT Filed: Mar. 24, 2009

(86) PCT No.: PCT/JP2009/055776
§ 371 (c)(1), (2), (4) Date: Sep. 21, 2010

(87) PCT Pub. No.: WO2009/119557
PCT Pub. Date: Oct. 1, 2009

(65) Prior Publication Data
US 2011/0018088 A1    Jan. 27, 2011

(30) Foreign Application Priority Data

Mar. 25, 2008 (JP) ................................. 2008-077977

(51) Int. Cl.
*C08K 5/05* (2006.01)
*B82Y 10/00* (2011.01)
*H01L 51/00* (2006.01)
*H01L 51/42* (2006.01)

(52) U.S. Cl.
CPC ............. *H01L 51/0047* (2013.01); *B82Y 10/00* (2013.01); *Y02E 10/549* (2013.01); *H01L 51/4253* (2013.01); *H01L 51/0007* (2013.01); *H01L 51/0036* (2013.01)
USPC .............................. 524/379; 524/495; 524/496

(58) Field of Classification Search
USPC .......................................... 524/379, 495, 496
See application file for complete search history.

(56) References Cited

U.S. PATENT DOCUMENTS

| 2005/0217722 A1* | 10/2005 | Komatsu et al. | 136/263 |
| 2008/0003422 A1* | 1/2008 | Ueda | 428/220 |
| 2008/0265214 A1* | 10/2008 | Steiger et al. | 252/500 |

FOREIGN PATENT DOCUMENTS

| JP | 62232974 | 4/1986 |
| JP | 2001-323219 A | 11/2001 |
| JP | 2004-051780 A | 2/2004 |
| JP | 2004-335737 A | 11/2004 |
| JP | 2005-064122 A | 3/2005 |
| JP | 2005-303266 A | 10/2005 |
| JP | 2006-310729 A | 11/2006 |
| JP | 2007-335760 A | 12/2007 |
| WO | 2007/029750 A1 | 3/2007 |
| WO | 2007/121252 A2 | 10/2007 |

OTHER PUBLICATIONS

Sung-Ho Jin, et al., "Optimization of process parameters for high-efficiency polymer photovoltaic devices based on P3HT:PCBM system," Solar Energy Materials and Solar Cells, 2007, pp. 1187-1193, vol. 91.
Gang Li, et al., "Solvent Annealing" Effect in Polymer Solar Cells Based on Poly(3-hexylthiophene) and Methanofullerenses, Advanced Functional Materials, 2007, pp. 1636-1644, vol. 14.
Jin Young Kim, et al., "Efficient Tandem Polymer Solar Cells Fabricated by All-Solution Processing," Science, Jul. 13, 2007, pp. 222-225, vol. 317.
Extended European Search Report issued Apr. 2, 2012 in European Patent Application No. 09724245.7.
Steffan Cook, et al., "Mixed Solvents for Morphology Control of Organic Solar Cell Blend Films", Japanese Journal of Applied Physics, 2008, vol. 47, No. 2, pp. 1238-1241.
D. Chirvase, et al., "Temperature dependent characteristics of poly(3 hexylthiophene)-fullerene based heterojunction organic solar cells", Journal of Applied Physics, Mar. 15, 2003, vol. 93, No. 6, pp. 3376-3383.
Jae Kwan Lee, et al., "Processing Additives for Improved Efficiency from Bulk Heterojunction Solar Cells", Journal of American Chemical Society, 2008, vol. 130, pp. 3619-3623.
Office Action issued in corresponding Chinese Application No. 200980109473.2, dated Sep. 24, 2012, with English translation.
European Office Action dated Jun. 11, 2013 issued in European Application No. 09724245.7.
Office Action dated Jun. 7, 2013 issued in Chinese Application No. 200980109473.2.
Japanese Office Action dated Feb. 12, 2013 issued in Japanese Application No. 2009-073717.
Japanese Office Action dated May 7, 2013 issued in Japanese Application No. 2009-073717.
Hoth et al., "High Photovoltaic Performance of Inkjet Printed Polymer: Fullerene Blends", Advanced Materials, 2007, vol. 19, pp. 3973-3978.
Decision of Rejection and Decision for Refusal of Amendment for JP 2009-073717 dated Jan. 28, 2014.

* cited by examiner

*Primary Examiner* — Edward Cain
(74) *Attorney, Agent, or Firm* — Sughrue Mion, PLLC

(57) ABSTRACT

A composition which comprises a conjugated polymer, a fullerene derivative, a first solvent, and a second solvent. When the sum of the weight of the first solvent and the weight of the second solvent is taken as 100, the weight of the first solvent is 70-97. The first solvent at 25° C. has a surface tension exceeding 25 mN/m, and the second solvent at 25° C. has a surface tension of 15-25 mN/m.

14 Claims, 2 Drawing Sheets

US 8,871,847 B2

COMPOSITION AND PHOTO-ELECTRIC CONVERTING ELEMENT OBTAINED USING THE SAME

CROSS REFERENCE TO RELATED APPLICATIONS

This application is a National Stage of International Application No. PCT/JP2009/055776 filed Mar. 24, 2009, claiming priority based on Japanese Patent Application No. 2008-077977 filed Mar. 25, 2008, the contents of all of which are incorporated herein by reference in their entirety.

TECHNICAL FIELD

The present invention relates to a composition and a photoelectric conversion device using the same.

BACKGROUND ART

Organic thin film solar cells are solar cells prepared by disposing an organic photoelectric conversion layer between two different types of electrodes. Compared with inorganic solar cells typically using silicon, the organic thin film solar cells may contribute to substantial reduction of production costs and are attracting attention as a less expensive solar photovoltaic device.

Generally, a composition containing a conjugated polymer compound, a fullerene derivative and a solvent is used for the film forming of an organic film contained in an organic photoelectric conversion layer. Typical examples thereof include the composition disclosed in Non-patent Document 1, containing o-dichlorobenzene as a solvent, poly(3-hexylthiophene) as a conjugated polymer compound and [6,6]-phenyl-C61-butyric acid methyl ester (PCBM) as a fullerene derivative.

NON-PATENT DOCUMENT 1: Advanced Functional Materials, 2007, vol. 17, pp. 1636-1644

DISCLOSURE OF THE INVENTION

Problems to be Solved by the Invention

However, film forming of an organic film of a large area using the aforementioned composition leads to the generation of defects caused by bubbles, and the defects cause the problem of the short circuit of organic thin film solar cells.

An object of the present invention is to provide a composition capable of suppressing defects caused by bubbles when the composition is used for film forming of a large area organic film contained in an organic solar cell.

Means for Solving the Problems

First the present invention provides a composition containing a conjugated polymer compound, a fullerene derivative, a first solvent and a second solvent, wherein the first solvent has a weight of 70 to 97 with the sum of the weight of the first solvent and the weight of the second solvent being 100 and has a surface tension at 25° C. of greater than 25 mN/m and the second solvent has a surface tension at 25° C. of 15 to 25 mN/m.

Second, the present invention provides a photoelectric conversion device containing a pair of electrodes at least one of which is transparent or semi-transparent and an organic layer having a photoelectric conversion function between the electrodes, wherein the organic layer is composed of the above composition.

Third, the present invention provides a process for producing a photoelectric conversion device containing a pair of electrodes at least one of which is transparent or semi-transparent and an organic layer having a photoelectric conversion function interposed between the electrodes, including a step of preparing the organic layer from the composition by using a coating method.

Forth, the present invention provides an image sensor containing the photoelectric conversion device.

Advantages of the Invention

Since the composition of the present invention prevents defects caused by bubbles when used for film forming of a large area organic film contained in an organic solar cell, the present invention is industrially very useful.

BEST MODE FOR CARRYING OUT THE INVENTION

Figure 1:
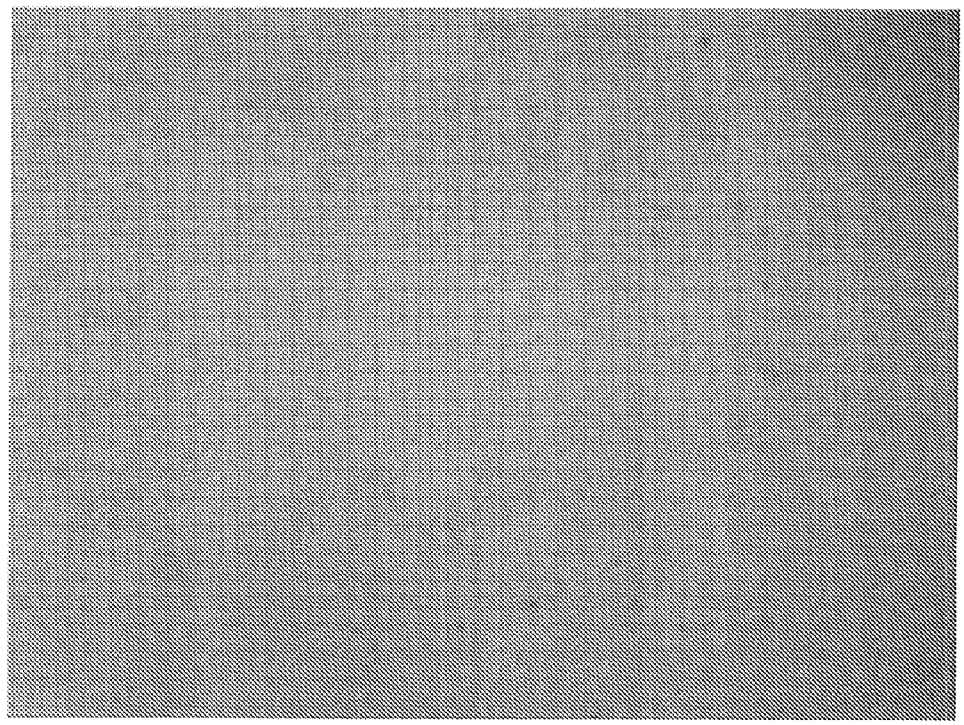
FIG. 1 is an image of the surface of an organic film formed by using composition 1.

Hereinafter the present invention will be described in detail.

(Composition)

The first solvent contained in the composition of the present invention has a surface tension of greater than 25 mN/m, preferably greater than 25 mN/m and smaller than 60 mN/m at 25° C. Specific examples of first solvents include toluene (27.9 mN/m), benzonitrile (34.5 mN/m), 1,3-benzodioxol (28.8 mN/m), o-xylene (29.8 mN/m), m-xylene (28.5 mN/m), p-xylene (28.0 mN/m), cyclohexanone (34.6 mN/m), chlorobenzene (33.0 mN/m), o-dichlorobenzene (36.7 mN/m), m-dichlorobenzene (35.4 mN/m), p-dichlorobenzene (32.5 mN/m), cis-decalin (32.2 mN/m), trans-decalin (29.9 mN/m), ethylbenzene (28.7 mN/m), 1,2,4-trimethylbenzene (29.2 mN/m), 1,3,5-trimethylbenzene (27.5 mN/m), chloroform (26.7 mN/m), tetradecane (26.1 mN/m) and ethylene glycol (48.4 mN/m). The numerical values in parentheses show the surface tension at 25° C. The surface tension values are described in "Lange's Handbook of Chemistry 13th edition", written and edited by John A. Dean, McGraw-Hill Companies, Inc., published in 1972, pp. 10/103-10/116. In consideration of the solubility of the conjugated polymer compound, aromatic compounds having a substituent are preferred, and chlorobenzene, o-dichlorobenzene, m-dichlorobenzene, p-dichlorobenzene, o-xylene, m-xylene, p-xylene and toluene are more preferred.

It is preferred that the first solvent dissolves 0.3% by weight or more of a conjugated polymer compound at 25° C. It is also preferred that the first solvent dissolves 0.3% by weight or more of a fullerene derivative at 25° C.

The second solvent contained in the composition of the present invention has a surface tension of 15 to 25 mN/m at 25° C. A solvent which is homogenously mixed with the first solvent is preferred as the second solvent. Specific examples of second solvents include isopropylamine (21.8 mN/m), ethanol (24.0 mN/m), n-octane (21.1 mN/m), dibutyl ether (22.4 mN/m), dipropyl ether (20.0 mN/m), n-decane (23.4 mN/m), 1-decene (23.5 mN/m), triethylamine (20.2 mN/m), n-nonane (22.4 mN/m), 1-nonene (22.6 mN/m), tert-butyl alcohol (16.9 mN/m), butyl ethyl ether (22.6 mN/m), 2-propanol (22.6 mN/m), propyl amine (21.8 mN/m), n-hexane (17.9 mN/m), 1-hexene (17.9 mN/m), n-heptane (19.7 mN/m), 1-heptene (19.8 mN/m) and methanol (22.1 mN/m). Preferred among them are alkanes including linear alkanes, branched alkanes and cycloalkanes, linear alcohols, branched alcohols and alicyclic alcohols. In consideration of the photoelectric conversion efficiency, n-octane is preferred. Further, solvents which do not impair the stability of the composition are preferred. More specifically, solvents which do not rapidly evaporate and which prevent solute components including a conjugated polymer compound and a fullerene derivative from coagulating and precipitating under the ordinary circumstances of storage and use are preferred.

The mixing ratio of the first solvent and the second solvent in the composition of the present invention can be adjusted based on the solubility, the surface tension and the amount of addition of the conjugated polymer compound and the fullerene derivative which are the solutes, the surface tension of the first solvent and the surface tension of the second solvent. The first solvent has a weight of 70 to 97 with the sum of the weight of the first solvent and the weight of the second solvent being 100. In consideration of the stability of the composition, the first solvent has a weight of preferably 90 to 95.

The composition of the present invention may contain a third solvent for improving film formability and reproducibility of organic film and power generation characteristics of photoelectric conversion devices. The third solvent has a weight of preferably 30 or less with the sum of the weight of the first solvent and the weight of the second solvent being 100.

The conjugated polymer compound used in the present invention means (1) a polymer substantially composed of a structure in which a double bond and a single bond are alternately arranged; (2) a polymer substantially composed of a structure in which a double bond and a single bond are arranged via a nitrogen atom; (3) a polymer substantially composed of a structure in which a double bond and a single bond are alternately arranged and a structure in which a double bond and a single bond are arranged via a nitrogen atom; and the like. Specific examples thereof include polymer compounds and the like which have one or more repeat units selected from the group consisting of unsubstituted or substituted fluorenediyl group, unsubstituted or substituted benzofluorenediyl group, unsubstituted or substituted dibenzofurandiyl group, unsubstituted or substituted dibenzothiophenediyl group, unsubstituted or substituted carbazolediyl group, unsubstituted or substituted thiophenediyl group, unsubstituted or substituted furandiyl group, unsubstituted or substituted pyrrolediyl group, unsubstituted or substituted benzothiadiazolediyl group, unsubstituted or substituted phenylene vinylenediyl group, unsubstituted or substituted thienylene vinylenediyl group and unsubstituted or substituted triphenylaminediyl group, in which the repeat units are bonded directly or via a linking group. In consideration of the charge transport properties, it is preferred that the conjugated polymer compound has a thiophene ring structure. It is more preferred that the conjugated polymer compound has a thiophenediyl group as a repeat unit.

With the sum of the weight of the first solvent and the weight of the second solvent being 100, the conjugated polymer compound contained in the composition of the present invention has a weight of preferably 0.1 to 3.0, more preferably 0.5 to 2.0 in consideration of the solubility.

Examples of fullerene derivatives contained in the composition of the present invention include $C_{60}$, $C_{70}$ and $C_{84}$ and derivatives thereof. Specific examples of structures of the fullerene derivative include the following.

[Formula 1]

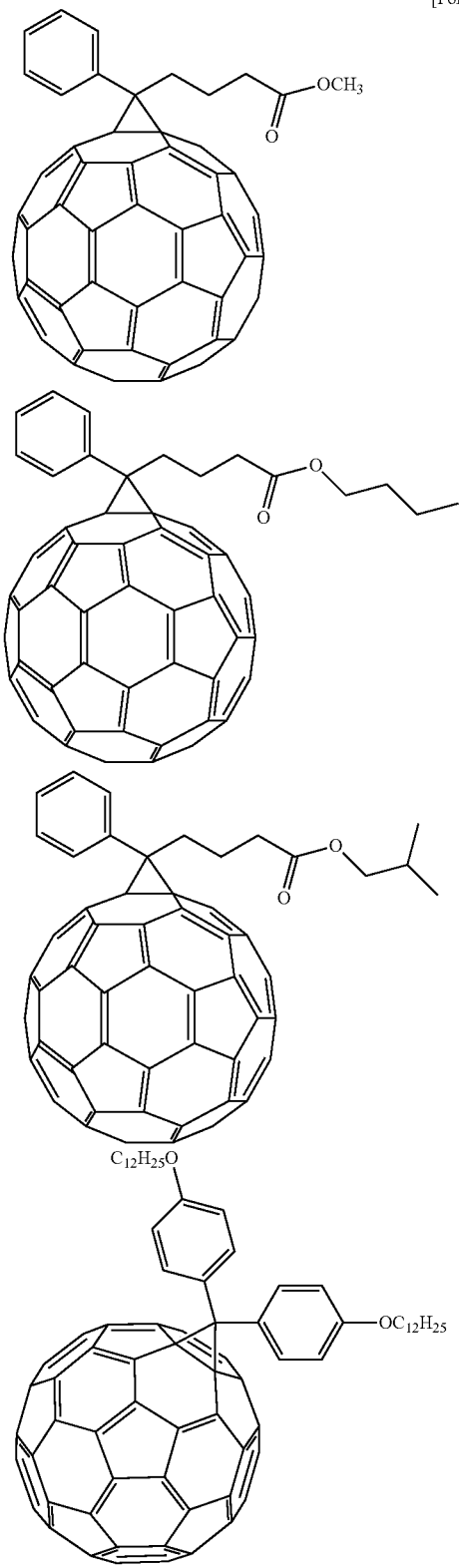

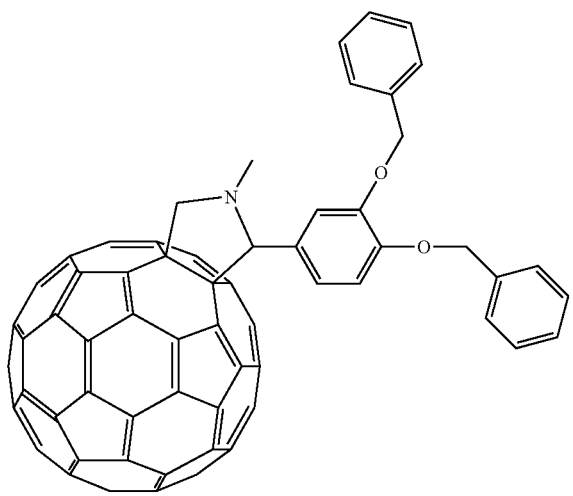

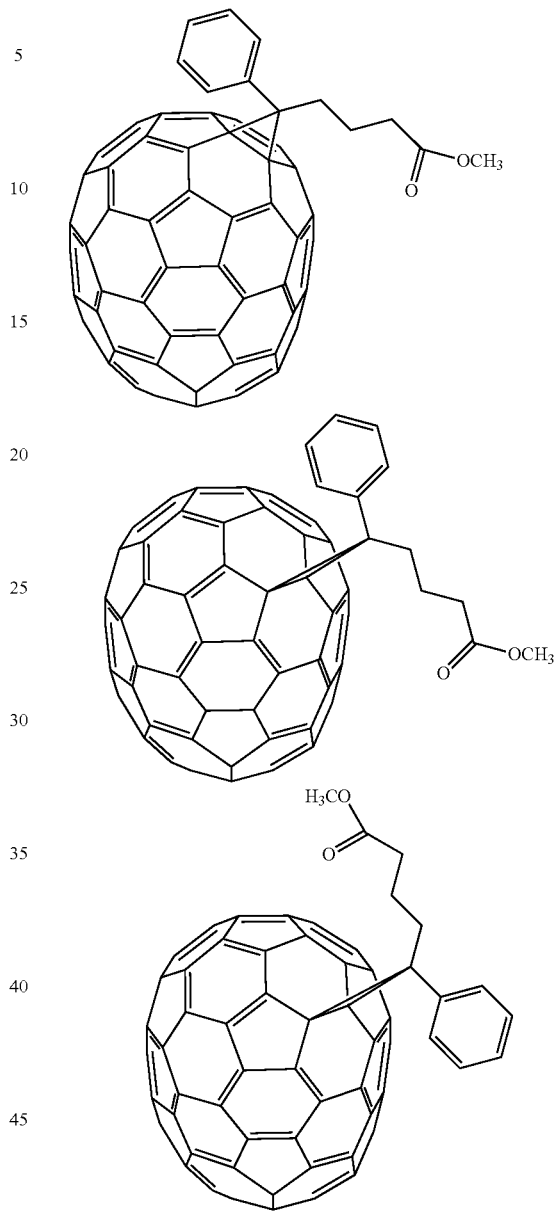

[Formula 2]

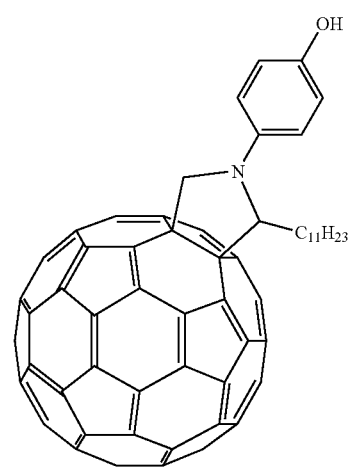

With the sum of the weight of the first solvent and the weight of the second solvent being 100, the fullerene derivative contained in the composition of the present invention has a weight of preferably 0.1 to 3.0, more preferably 0.5 to 2.0 in consideration of the solubility.

Most of the conjugated polymer compound and the fullerene derivative contained in the composition of the present invention is preferably dissolved in the composition, but a part of either of them may be coagulated in a size of 100 nm or less.

(Organic Film)

The organic film obtained from the composition of the present invention is used as, for example, an organic layer which converts light energy into electric energy and functions as an organic layer which is a power generation source of photoelectric conversion devices. Generally a photoelectric conversion device contains a layer of organic film which converts light energy into electric energy per cell, but as described in, for example, Science, 2007, vol. 317, pp. 222 to 225, a photoelectric conversion device may contain two or more layers of organic film to achieve higher power generation efficiency.

The organic film used in the present invention is formed on a solid substrate. In other words, the organic film is not an independent body, but formed on a support to be used in that state. Solid substrates of both rigid types and flexible types may be used as the support. Examples of rigid substrates include heat resistant glass and engineering plastics. Examples of flexible substrates include metal film and resin film. A lightweight and flexible organic thin film solar cell can be produced by forming an organic film on a flexible substrate.

Further, while an organic film may be directly formed on the surface of the solid substrate, a transparent conductive solid electrode layer can be formed on the surface of a transparent solid substrate to be used as a transparent electrode of an organic thin film solar cell. Transparent conductive oxide films such as indium tin oxide (ITO), metal thin films of Ag or Au, alloy thin films composed of two or more metals or transparent conductive polymers such as poly(ethylenedioxythiophene) (PEDOT), which have both transparency and electric conductivity, may be used as the transparent conductive solid electrode layer.

In addition, it is preferred that the surface of the solid substrate is washed or modified by a physical process such as UV-ozone treatment, corona discharge treatment or plasma treatment to improve the wettability of the composition of the present invention and the interface adhesion between an organic layer and a substrate. Further, a method in which the surface of the solid substrate is subjected to chemical modification with a silane coupling agent, a titanate coupling agent, a thiol self-assembled monolayer or the like is effective.

When forming an organic film using the composition of the present invention, a coating method can be employed. When forming an intermittent pattern such as integrated modules, a printing method using any printing plate of an intaglio, a letterpress, a lithographic printing plate and a stencil plate is preferred. Since a uniform thin film can be formed, a gravure printing method which is one of the printing methods using an intaglio is more preferred. When a film forming is uniformly performed on the entire surface of a substrate as in the case of a large area cell, a slit coating method, a capillary coating method, a gravure coating method, a micro-gravure coating method, a bar coating method, a knife coating method and a spin coating method are preferred. Further, when a colored or good-design photoelectric conversion device is intended and the surface of the same substrate is coated with fine organic layers of different colors, either of a nozzle printing method or an inkjet printing method may be selected.

(Photoelectric Conversion Device)

An aspect of the present invention includes an organic thin film solar cell which contains an organic layer composed of the composition of the present invention and having a function to convert light energy into electric energy (photoelectric conversion function) and a pair of electrodes at least one of which is transparent or semi-transparent between which the organic layer is interposed.

The photoelectric conversion device of the present invention has a structure in which two electrodes at least one of which is transparent or semi-transparent are disposed to be faced with each other with the aforementioned organic layer interposed therebetween. The transparent or semi-transparent electrode may be an electrode of transparent conductive oxide film such as indium tin oxide (ITO), metal thin film of Ag or Au, alloy thin film composed of two or more metals or transparent conductive polymer such as poly(ethylenedioxythiophene)(PEDOT), which has both transparency and electric conductivity. The above-described transparent electrode, metal such as Al, Ag, Au, Ti and Fe and nonmetal such as graphite, which are non-transparent, may be used as the electrode faced with the transparent electrode.

When forming an organic layer contained in the photoelectric conversion device of the present invention using the composition of the present invention, a coating method can be employed. When forming an intermittent pattern such as integrated modules, a printing method using any printing plate of an intaglio, a letterpress, a lithographic printing plate and a stencil plate is preferred. Since a uniform thin film can be formed, a gravure printing method which is one of the printing methods using an intaglio is more preferred. When a film forming is uniformly performed on the entire surface of a substrate as in the case of a large area cell, a slit coating method, a capillary coating method, a gravure coating method, a micro-gravure coating method, a bar coating method, a knife coating method and a spin coating method are preferred. Further, when a colored or good-design photoelectric conversion device is intended and the surface of the same substrate is coated with fine organic layers of different colors, either of a nozzle printing method or an inkjet printing method can be selected. Furthermore, by subjecting the resulting organic layer to heat treatment, the solvent remaining in the organic layer can be removed and the contact strength between the organic layer and the underlayer can be improved, and these effects lead to the improvement of the power generation efficiency. The heat treatment temperature is preferably higher than 60° C. and lower than 250° C. The heat treatment time is preferably longer than 1 minute and shorter than 24 hours. The heat treatment can be performed in the air or an inert gas atmosphere such as nitrogen or argon. It is more preferred that the heat treatment is performed in an inert gas atmosphere so as to prevent the degradation of organic layer materials due to thermal oxidation or the like.

Further, the photoelectric conversion device of the present invention can have, between the electrodes and the organic layer, an intermediate layer which has a function of improving power generation characteristics and process durability, such as selectively extracting electrons or holes, lowering energy barrier between the electrodes and the organic layer, film formability for forming a film contained in a laminate, or reducing damage of the film on an underlayer. The intermediate layer is contained as an underlayer and/or an upper layer of the organic film. The intermediate layer can be formed by a gas phase method such as a vapor deposition method, a sputtering method and a laser ablation method or a wet method such as a sol-gel method, a spray coating method and a coating method as in the case of forming an organic film.

The photoelectric conversion device of the present invention generates photoelectromotive force between the electrodes upon irradiation of light such as sunlight through the transparent or semi-transparent electrode, and thus can work as an organic thin film solar cell. A plurality of organic thin film solar cells can be integrated to be used as an organic thin film solar cell module.

The photoelectric conversion device of the present invention generates photocurrent upon irradiation of light through the transparent or semi-transparent electrode with voltage applied between the electrodes, and thus can work as an organic photosensor. Further, the photoelectric conversion device of the present invention can be used as an organic image sensor composed of the organic photosensor as a light receiving unit, a drive circuit unit for detecting the output of signal current generated by the organic photosensor and reading the signal charge, and a wiring for connecting the organic photosensor and the drive circuit. The organic photosensor can be used with a color filter attached to the light incident surface so as to achieve color selectivity for the light to be detected. Alternatively, a plurality of types of organic photosensors having light absorbing properties highly selective to each of the three primary colors of light can be used. As the drive circuit, an IC chip formed of a transistor using single crystal silicon, or those composed of a thin film transistor using a compound semiconductor such as polycrystal silicon, amorphous silicon or cadmium selenide, or a conjugated organic compound semiconductor such as pentacene, can be used. The organic image sensor has the advantages of lower production costs, smaller installation areas and the like as a photographing device for scanners, digital cameras, digital video cameras and the like compared to conventional image sensors using a charge coupled device (CCD) or a complementary metal oxide semiconductor (CMOS). Further, due to the diversity of conjugated compounds, organic photosensors having various photosensitive properties can be used, and so an organic image sensor having properties suitable for the intended use can be provided.

EXAMPLES

Hereinafter Examples will be shown in order to describe the present invention in more detail, but the present invention is not limited thereto.

Example 1

(Preparation of Composition 1)

o-Dichlorobenzene (having a surface tension at 25° C. of 36.7 mN/m) was used as the first solvent and n-octane (having a surface tension at 25° C. of 21.1 mN/m) was used as the second solvent. They were weighed so that they had a weight ratio of 90% by weight and 10% by weight, respectively, and mixed. To the mixed solvent were added poly(3-hexylthiophene) (P3HT) (trade name lisicon SP001, lot. EF431002 available from Merck KGaA) as a conjugated polymer compound and PCBM (trade name E100, lot. 7B0168-A available from Frontier Carbon Corporation) as a fullerene derivative. For the concentration of the solutes, the concentration of P3HT was 1.5% by weight and that of PCBM was 1.2% by weight based on the total weight of the composition. After the addition of the solute components, the mixture was stirred at 70° C. for 2 hours and then filtered using a filter having a pore diameter of 0.2 nm to prepare a composition 1.

Test Example 1

(Printing Test of Organic Film)

Using a gravure printing apparatus (Model K303 made by RK Print Coat Instruments Ltd.) and an intaglio on which a 10×100 mm rectangular pattern was engraved, a test of printing properties was performed by a gravure printing method. A PEN film substrate was coated with an ITO film (film thickness: about 150 nm) and the composition 1 was printed on the ITO surface by gravure printing. Whether the organic film had bubbles or not was observed in an undried condition after printing, and the film was evaluated by the presence of defects caused by bubbles. The result is shown in the following Table 1. In addition, an image of the surface of the organic film after drying taken by a microscope (Model: KH-7700 made by HIROX Co., Ltd.) is shown in FIG. 1.

Example 2

(Preparation and Evaluation of Organic Thin Film Solar Cell)

A glass substrate on which an ITO film was formed in a thickness of 150 nm by a sputtering method was subjected to surface treatment by UV-ozone treatment. Then, an organic film was formed by applying the composition 1 thereto by spin coating to prepare an organic layer. After that, the organic layer was subjected to heat treatment using a hot plate in the air at 150° C. for 3 minutes. Then the organic layer was dried in vacuum at room temperature for 60 minutes. The film thickness after drying was about 150 nm. Thereafter aluminum was deposited thereon in a thickness of 100 nm by a vacuum evaporator. The degree of vacuum in the vapor deposition was 1 to 9×10$^{-4}$ Pa. The resulting organic thin film solar cell which was a photoelectric conversion device was a square of 2 mm×2 mm. The resulting organic thin film solar cell was irradiated with light at an irradiance of 100 mW/cm$^2$ with an AM1.5G filter using Solar Simulator (trade name YSS-80 made by Yamashita Denso Corporation), and the current and the voltage obtained were measured to determine the photoelectric conversion efficiency. The result is shown in the following Table 2.

Example 3

(Preparation of Composition 2)

o-Dichlorobenzene was used as the first solvent and n-octane was used as the second solvent. They were weighed so that they had a weight ratio of 92% by weight and 8% by weight, respectively, and mixed. Composition 2 was prepared in the same manner as in Example 1 except for the above.

Example 4

(Preparation and Evaluation of Organic Thin Film Solar Cell)

An organic thin film solar cell was prepared by the same procedure as in Example 2 except for using the composition 2 instead of the composition 1, and the photoelectric conversion efficiency was measured. The result is shown in the following Table 2.

Test Example 2

(Printing Test of Organic Film)

An organic film was formed by the same procedure as in Test Example 1 except for using the composition 2 instead of the composition 1. Whether the organic film had bubbles or not was observed in an undried condition after printing, and the film was evaluated by the presence of defects caused by bubbles. The result is shown in the following Table 1.

Example 5

(Preparation of Composition 3)

o-Dichlorobenzene was used as the first solvent and n-hexane (having a surface tension at 25° C. of 17.9 mN/m) was used as the second solvent. They were weighed so that they had a weight ratio of 90% by weight and 10% by weight, respectively, and mixed. Composition 3 was prepared in the same manner as in Example 1 except for the above.

Example 6

(Preparation and Evaluation of Organic Thin Film Solar Cell)

An organic thin film solar cell was prepared by the same procedure as in Example 2 except for using the composition 3 instead of the composition 1, and the photoelectric conversion efficiency was measured. The result is shown in the following Table 2.

Test Example 3

(Printing Test of Organic Film)

An organic film was formed by the same procedure as in Test Example 1 except for using the composition 3 instead of the composition 1. Whether the organic film had bubbles or not was observed in an undried condition after printing, and the presence of defects caused by bubbles was evaluated. The result is shown in the following Table 1.

Example 7

(Preparation of Composition 4)

o-Dichlorobenzene was used as the first solvent and tert-butyl alcohol (having a surface tension at 25° C. of 16.9 mN/m) was used as the second solvent. They were weighed so that they had a weight ratio of 90% by weight and 10% by weight, respectively, and mixed. Composition 4 was prepared in the same manner as in Example 1 except for the above.

Example 8

(Preparation and Evaluation of Organic Thin Film Solar Cell)

An organic thin film solar cell was prepared by the same procedure as in Example 2 except for using the composition 4 instead of the composition 1, and the photoelectric conversion efficiency was measured. The result is shown in the following Table 2.

Test Example 4

(Printing Test of Organic Film)

An organic film was formed by the same procedure as in Test Example 1 except for using the composition 4 instead of the composition 1. Whether the organic film had bubbles or not was observed in an undried condition after printing, and the film was evaluated by the presence of defects caused by bubbles. The result is shown in the following Table 1.

Comparative Example 1

(Preparation of Composition 5)

o-Dichlorobenzene was used as the first solvent and no second solvent was used. Composition 5 was prepared in the same manner as in Example 1 except for the above.

Test Example 5

(Printing Test of Organic Film)

Figure 2:
FIG. 2 is an image of the surface of an organic film formed by using composition 5.

An organic film was formed by the same procedure as in Test Example 1 except for using the composition 5 instead of the composition 1. Whether the organic film had bubbles or not was observed in an undried condition after printing, and the film was evaluated by the presence of defects caused by bubbles. The result is shown in the following Table 1. An image of the surface of the organic film after drying taken by a microscope is shown in FIG. 2.

Comparative Example 2

(Preparation of Composition 6)

o-Dichlorobenzene was used as the first solvent and tetradecane (having a surface tension at 25° C. of 26.1 mN/m) was used as the second solvent. They were weighed so that they had a weight ratio of 90% by weight and 10% by weight, respectively, and mixed. Composition 6 was prepared in the same manner as in Example 1 except for the above.

Test Example 6

(Printing Test of Organic Film)

An organic film was formed by the same procedure as in Test Example 1 except for using the composition 6 instead of the composition 1. Whether the organic film had bubbles or not was observed in an undried condition after printing, and the film was evaluated by the presence of defects caused by bubbles. The result is shown in the following Table 1.

Comparative Example 3

(Preparation of composition 7)

o-Dichlorobenzene was used as the first solvent and 1,3,5-trimethylbenzene (having a surface tension at 25° C. of 27.5 mN/m) was used as the second solvent. They were weighed so that they had a weight ratio of 70% by weight and 30% by weight, respectively, and mixed. Composition 6 was prepared in the same manner as in Example 1 except for the above. The result is shown in the following Table 1.

Test Example 7

(Printing Test of Organic Film0

An organic film was formed by the same procedure as in Test Example 1 except for using the composition 7 instead of the composition 1. Whether the organic film had bubbles or not was observed in an undried condition after printing, and the film was evaluated by the presence of defects caused by bubbles. The result is shown in the following Table 1.

TABLE 1

|  | Second solvent | Surface tension of second solvent (mN/m) | Weight ratio of solvents (first solvent:second solvent) | Defects caused by bubbles |
|---|---|---|---|---|
| Test Example 1 | n-octane | 21.1 | 90:10 | Not present |
| Test Example 2 | n-octane | 21.1 | 92:8 | Not present |
| Test Example 3 | n-hexane | 17.9 | 90:10 | Not present |
| Test Example 4 | tert-butyl alcohol | 16.9 | 95:5 | Not present |
| Test Example 5 | — | — | 100:0 | Present |
| Test Example 6 | n-tetradecane | 26.1 | 90:10 | Present |
| Test Example 7 | 1,3,5-trimethylbenzene | 27.5 | 70:30 | Present |

TABLE 2

| | Relative value with the photoelectric conversion efficiency of Example 6 being 1 |
|---|---|
| Example 2 | 1.38 |
| Example 4 | 1.16 |
| Example 6 | 1.00 |
| Example 8 | 1.11 |

Industrial Applicability

Since the composition of the present invention prevents defects caused by bubbles when used for film forming of a large area organic film contained in an organic solar cell, the present invention is industrially very useful.

The invention claimed is:

1. A composition comprising:
a conjugated polymer compound, a fullerene derivative, a first solvent and a second solvent,
wherein the first solvent is an aromatic compound having a substituent, has a weight of 70 to 97 with the sum of the weight of the first solvent and the weight of the second solvent being 100, and has a surface tension at 25° C. of greater than 25mN/m, and
wherein the second solvent is selected from the group consisting of a linear alkane, a branched alkane, a cycloalkane, a branched alcohol and an alicyclic alcohol and the second solvent has a surface tension at 25° C. of 15 to 25 mN/m.

2. The composition according to claim 1, wherein the first solvent has a weight of 90 to 95.

3. The composition according to claim 1, wherein the conjugated polymer compound has a thiophene ring structure.

4. A photoelectric conversion device comprising a pair of electrodes at least one of which is transparent or semi-transparent and an organic layer having a photoelectric conversion function between the electrodes, wherein the organic layer is composed of the composition according to claim 1.

5. The photoelectric conversion device according to claim 4, wherein the organic layer is formed by a coating method.

6. The photoelectric conversion device according to claim 5, wherein the coating method is a printing method using an intaglio, a letterpress, a lithographic printing plate or a stencil plate.

7. The photoelectric conversion device according to claim 6, wherein the printing method is a gravure printing method.

8. The photoelectric conversion device according to claim 5, wherein the coating method is a slit coating method, a capillary coating method, a gravure coating method, a microgravure coating method, a bar coating method, a knife coating method or a spin coating method.

9. The photoelectric conversion device according to claim 5, wherein the coating method is a nozzle printing method or an inkjet printing method.

10. A process for producing a photoelectric conversion device comprising a pair of electrodes at least one of which is transparent or semi-transparent and an organic layer having a photoelectric conversion function interposed between the electrodes, comprising a step of preparing the organic layer from the composition according to claim 1 by using a coating method.

11. An image sensor comprising the photoelectric conversion device according to claim 4.

12. The composition according to claim 1, wherein the first solvent is chlorobenzene, o-dichlorobenzene, m-dichlorobenzene, p-dichlorobenzene, o-xylene, m-xylene, p-xylene or toluene.

13. The composition according to claim 12, wherein the first solvent is o-dichlorobenzene.

14. The composition according to claim 1, wherein the first solvent has a weight of 70 to 90.

* * * * *